(12) United States Patent
Park et al.

(10) Patent No.: US 9,261,743 B2
(45) Date of Patent: Feb. 16, 2016

(54) LIQUID CRYSTAL DISPLAY DEVICE HAVING DUAL LINK STRUCTURE AND METHOD OF MANUFACTURING THE SAME

(71) Applicant: LG Display Co., Ltd., Seoul (KR)

(72) Inventors: Je Hyung Park, Gumi-si (KR); Tae Yong Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 208 days.

(21) Appl. No.: 13/929,571

(22) Filed: Jun. 27, 2013

(65) Prior Publication Data
US 2014/0168591 A1 Jun. 19, 2014

(30) Foreign Application Priority Data
Dec. 18, 2012 (KR) .................. 10-2012-0148798

(51) Int. Cl.
*G02F 1/1345* (2006.01)

(52) U.S. Cl.
CPC .. *G02F 1/13452* (2013.01); *G02F 2001/13456* (2013.01)

(58) Field of Classification Search
CPC .............. H01L 27/124; H01L 27/3276; H01L 29/41733; H01L 29/786; H01L 29/4908; H01L 29/42384; H01L 29/78669; H01L 29/78696; H01L 29/45; H01L 29/78624; H01L 29/78678; H01L 51/5203; H01L 21/47; G02F 1/13452; G02F 1/133627; G02F 1/13362; G02F 1/1333; G02F 1/1343; G02F 1/136; G02F 1/1339; G02F 1/136286; G02F 1/1368; G02F 1/134363; G02F 1/136227; G02F 1/13454; G02F 1/13439; G02F 1/1345; G02F 1/133345; G02F 1/134336; G02F 1/133514; G02F 1/13394; G02F 1/134309; G02F 1/13458; G02F 2001/13629; G02F 2001/136295; G02F 2001/133388; G02F 2001/134318; G02F 2001/13456; G02F 2001/1635; G02F 2001/1676; G02F 2201/123; G02F 2201/50; G02F 2201/124; G09G 2300/0426; G09G 3/3688; G09G 3/3655
USPC ............ 257/59, E33.062, E29.273, E21.409; 438/158, 585, 623; 349/43, 138, 106, 349/139, 143, 42, 46, 140, 141, 152, 153, 349/156, 158, 149; 345/92, 204, 55
See application file for complete search history.

(56) References Cited

U.S. PATENT DOCUMENTS

| 5,835,177 A * | 11/1998 | Dohjo et al. .................. 349/147 |
| 2004/0051836 A1 | 3/2004 | Jung et al. |
| 2007/0146611 A1 | 6/2007 | Kang |

FOREIGN PATENT DOCUMENTS

| CN | 1495477 A | 5/2004 |
| CN | 1584712 A | 2/2005 |

(Continued)

OTHER PUBLICATIONS

Office Action for Chinese Patent Application No. CN 201310325584.5, Dec. 1, 2015, 15 Pages.

*Primary Examiner* — Thoi Duong
(74) *Attorney, Agent, or Firm* — Fenwick & West LLP

(57) ABSTRACT

Disclosed is an LCD device having a dual link structure and a method of manufacturing the same, which can reduce a width of a bezel. A link line structure includes a plurality of first and second link lines which are alternately disposed. The first and second link lines are formed on different layers. Also, embodiments herein provide a method which can reduce the number of masks used in a manufacturing process and can easily manufacture the LCD device in consideration of the possibility of misalignment of exposure equipment.

5 Claims, 20 Drawing Sheets

(56) References Cited

FOREIGN PATENT DOCUMENTS

| CN | 101494226 A | 7/2009 |
| JP | 2005-165051 A | 6/2005 |
| KR | 10-2011-0036456 A | 4/2011 |

\* cited by examiner

LIQUID CRYSTAL DISPLAY DEVICE HAVING DUAL LINK STRUCTURE AND METHOD OF MANUFACTURING THE SAME

CROSS-REFERENCE TO RELATED APPLICATIONS

This application claims the benefit of Korean Patent Application No. 10-2012-0148798 filed on Dec. 18, 2012, which is hereby incorporated by reference as if fully set forth herein.

BACKGROUND

1. Field of Technology

The present invention relates to a liquid crystal display (LCD) device and a method of manufacturing the same, and more particularly, to a LCD device having a dual link structure which includes a plurality of link lines disposed at dense intervals on a first layer and a second layer different from the first layer. The present invention provides an LCD device having a dual link structure, and particularly, provides a method of manufacturing an LCD device which proposes a new manufacturing process for reducing the number of masks used in a manufacturing process and can easily manufacture the LCD device in consideration of the possibility of misalignment of exposure equipment.

2. Discussion of the Related Art

FIG. 1 is a plan view illustrating an array substrate in which a plurality of switching elements are provided, in a general LCD device. In the LCD device, two substrates with electrodes formed therein face each other and are adhered to each other by a sealant, and liquid crystal is injected therebetween. The liquid crystal is a material having light transmittance anisotropy, and changes a phase of light according to a direction in which the light passes through the liquid crystal. The operation principle of LCD devices is that a polarizer, which changes a phase of light and transmits only specific directional light, transmits and blocks light to realize an image. Also, an alignment direction of the liquid crystal is adjusted by selectively applying voltages to the electrodes formed on the two substrates, in which case the liquid crystal is driven with electric fields generated by the voltages applied to the electrodes and thus the alignment direction of the liquid crystal is changed.

A panel, which is configured with the two coupled substrates and the liquid crystal injected therebetween, is called a LCD panel.

A process of manufacturing the LCD panel includes: a process of manufacturing an array substrate in which a plurality of pixel electrodes (first electrodes) for applying an electric field to the liquid crystal and a plurality of thin film transistor (TFTs, switching elements) for selectively supplying a voltage to a corresponding pixel electrode are provided; a process of manufacturing a color filter substrate, facing the array substrate, in which a plurality of common electrodes (second electrodes) for applying the electric field to the liquid crystal and a plurality of red (R), green (G), and blue (B) color filters are provided; and a process of injecting the liquid crystal between the two substrates.

FIG. 1 schematically illustrates a plan view of an array substrate. FIG. 2 is an enlarged sectional view of an area A illustrated in FIG. 1.

Referring to FIG. 1, an array substrate 1 is divided into an active area AA, in which a plurality of unit pixels are arranged, and an inactive area NA disposed outside the active area AA.

In the active area, a plurality of gate lines GL are laterally arranged, and a plurality of data lines DL are vertically arranged to perpendicularly intersect the gate lines GL.

One area defined by the gate line GL and the data line DL is a unit pixel area C. An area C of FIG. 1 illustrates the enlarged unit pixel area C.

In the one unit pixel area, one pixel electrode P for applying an electric field to liquid crystal is provided, and a thin film transistor (switching element) Tr for selectively applying a voltage to the pixel electrode P is provided at a corner portion of the unit pixel area.

The thin film transistor Tr includes a gate electrode connected to a corresponding gate line GL, a source electrode connected to a corresponding data line DL, a drain electrode facing the source electrode, and an active layer that is a semiconductor layer formed of amorphous silicon or polycrystalline silicon.

In the thin film transistor Tr, when a scan signal is applied from the gate line to the gate electrode, a channel of the active layer is opened by the scan signal, and simultaneously, when a pixel signal is applied from the data line, the pixel signal is transferred to the drain electrode through the source electrode and the active layer. Since the drain electrode is connected to the pixel electrode, the pixel signal is applied to the pixel electrode.

A driving circuit unit (D-IC) for supplying signals to the gate lines GL and data lines DL disposed in the active area AA is disposed in the inactive area NA. The driving circuit unit is generally divided into a gate driving circuit unit and a data driving circuit unit, but, one driving circuit unit for supplying both a gate signal and a data signal may be used as shown in FIG. 1. FIG. 1 illustrates one driving circuit unit supplying both a gate signal and a data signal.

Moreover, a plurality of link lines are further disposed in the inactive area NA. The link lines are divided into a plurality of gate link lines GLL that connect the gate lines GL to the driving circuit unit (D-IC) and a plurality of data link lines DLL that connect the data lines DL to the driving circuit unit (D-IC).

Referring to FIG. 1, the area A illustrates the gate link lines, and an area B illustrates the data link lines.

The gate link lines GLL are disposed on a first layer with the gate lines GL disposed therein, and the data link lines DLL are disposed on a second layer with the data lines DL disposed therein.

The gate link lines GLL are respectively connected to the gate lines GL, and the data link lines DLL are respectively connected to the data lines DL.

Moreover, a seal pattern S that couples the array substrate 1 to the color filter substrate (not shown) facing the array substrate 1 is further disposed in the inactive area NA.

The seal pattern S passes over the gate link lines GLL and the data link lines DLL and is disposed in a closed loop type in the inactive area. The seal pattern S is generally formed of a photosensitive organic material having adhesiveness.

FIG. 2 is an enlarged sectional view of the area A illustrated in FIG. 1. Referring to FIG. 2, the plurality of gate link lines GLL are disposed on a first substrate 11. Although not shown, the plurality of gate lines GL are disposed on the first substrate 11. Thus, a gate line and a gate link line GLL are formed of the same material, on the same layer.

A plurality of the gate link lines GLL are covered and insulated by a gate insulating layer 12, and a passivation layer (insulating layer) 13 is further formed on the gate insulating layer 12. Although not shown in FIG. 2, each of a data line and a data link line are formed in plurality on the gate insulating layer 12. The seal pattern S that couples a color filter substrate (upper substrate) 2 to an array substrate (lower substrate) is formed over the gate link lines GLL to couple the two substrates.

Like this, the gate link lines GLL and the data link lines DLL are formed on the same layer as their respective gate lines GL and data lines DL, namely, the gate link lines GLL are formed on the first substrate 11 and the data link lines DLL are formed on the gate insulating layer 12. However, in recent LCD devices, a bezel tends to narrow, and thus, the area of the inactive area is continuously reduced. On the other hand, resolutions of the LCD devices increase continuously, causing an increase in the numbers of gate link lines of data link lines disposed in a unit area.

Moreover, in manufacturing an LCD device, a need for reducing the number of masks to increase productivity is continuously increasing. That is, in manufacturing a thin film transistor, since the number of masks used to manufacture the LCD device has a close relationship with the cost and a yield rate, development of a process for reducing the number of masks is a very important production factor.

SUMMARY

Accordingly, the embodiments herein are directed to provide a LCD device having a dual link structure and a method of manufacturing the same that substantially obviate one or more problems due to limitations and disadvantages of the related art.

An aspect of the present invention is directed to provide a structure of a LCD device, in which more gate link lines and data link lines are disposed in each unit area compared to the related art, and a method of manufacturing the LCD device which can reduce the number of masks used in producing an array substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The embodiments herein provide a method of manufacturing a LCD device, which can reduce the number of masks needed to manufacture the LCD device. Especially, the present invention provides an improved process such that a line width of a link line does not become narrower than a designed line width in a process of patterning the link line in which a semiconductor layer and a conductive layer are stacked, in forming the link line for connecting a gate line and a data line to a driving circuit unit.

To achieve these and other advantages and in accordance with the purpose of the invention, as embodied and broadly described herein, there is provided a method of manufacturing a LCD device, having a dual link structure, including: preparing a first substrate that includes a pixel area including a switching unit and a non-pixel area which includes a link part and surrounds the pixel area; forming a gate electrode in the switching unit on the first substrate, and forming a first link line in the link part; forming a first insulating layer covering the first substrate; sequentially forming an active layer, an ohmic contact layer, and a source metal layer on the first insulating layer; patterning the active layer, the ohmic contact layer, and the source metal layer in one mask process to form a data line, a channel pattern branching from the data line, and a second link line, the channel pattern and the second link line being formed in the switching unit; forming a second insulating layer on the first substrate to cover the channel pattern and a second link line; removing the second insulating layer from on the channel pattern and the link part; forming a transparent electrode layer on the first substrate from which the second insulating layer on the channel pattern and the link part has been removed; forming a photoresist pattern on the transparent electrode layer for a channel to be defined on the gate electrode; and sequentially removing the transparent electrode layer, the source metal layer, and the ohmic contact layer from on the channel by using the photoresist pattern as an etching mask to define the channel, and forming a pixel electrode.

In another aspect, there is provided a LCD device, having a dual link structure, including: a substrate; a plurality of first link lines formed on the substrate; a first insulating layer formed over the plurality of first link lines; and a plurality of second link lines formed on the first insulating layer, each of the plurality of second link lines comprising a plurality of layers including at least an active layer, an ohmic layer, a source metal layer, and a transparent electrode layer; wherein a width of the ohmic layer, a width of the source metal layer, and a width of the transparent electrode layer are narrower than a width of the active layer.

In another embodiment, there is provided a method of manufacturing a LCD device, having a dual link structure, including: forming a substrate; forming a plurality of first link lines on the substrate; forming a first insulating layer over the plurality of first link lines; and forming a plurality of second link lines on the first insulating layer, each of the plurality of second link lines comprising a plurality of layers including at least an active layer, an ohmic layer, a source metal layer, and a transparent electrode layer; wherein a width of the ohmic layer, a width of the source metal layer, and a width of the transparent electrode layer are narrower than a width of the active layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 6AA to 6JJ are sequence views illustrating a process of forming a link line in a link area of an inactive area according to one embodiment.

FIGS. 7AA to 7II are sequence views illustrating a process of forming a link line in the link area of the inactive area.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

<First Embodiment>

Figure 1:
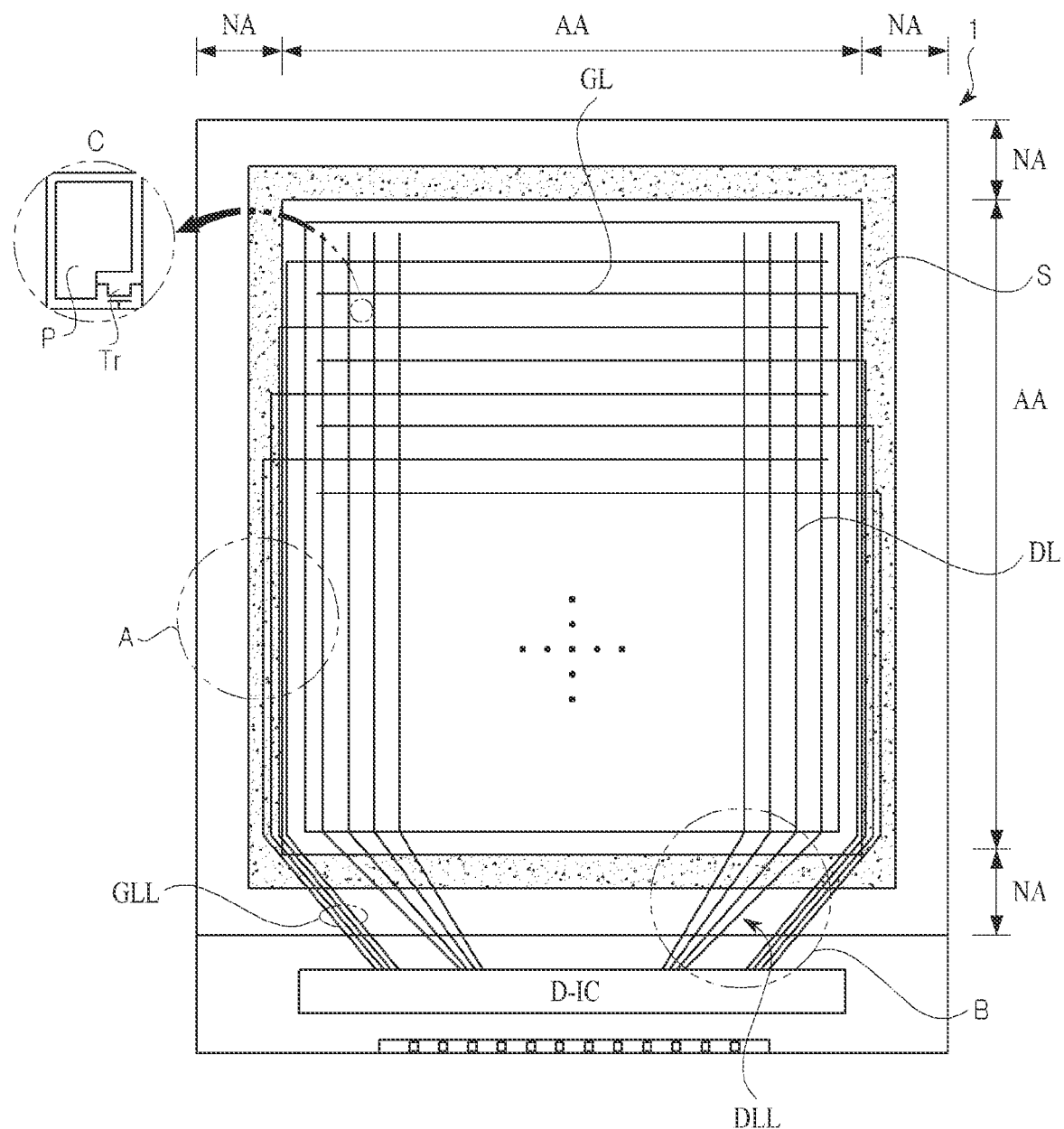
FIG. 1 is a plan view illustrating an array substrate in a general LCD device.
Figure 2:
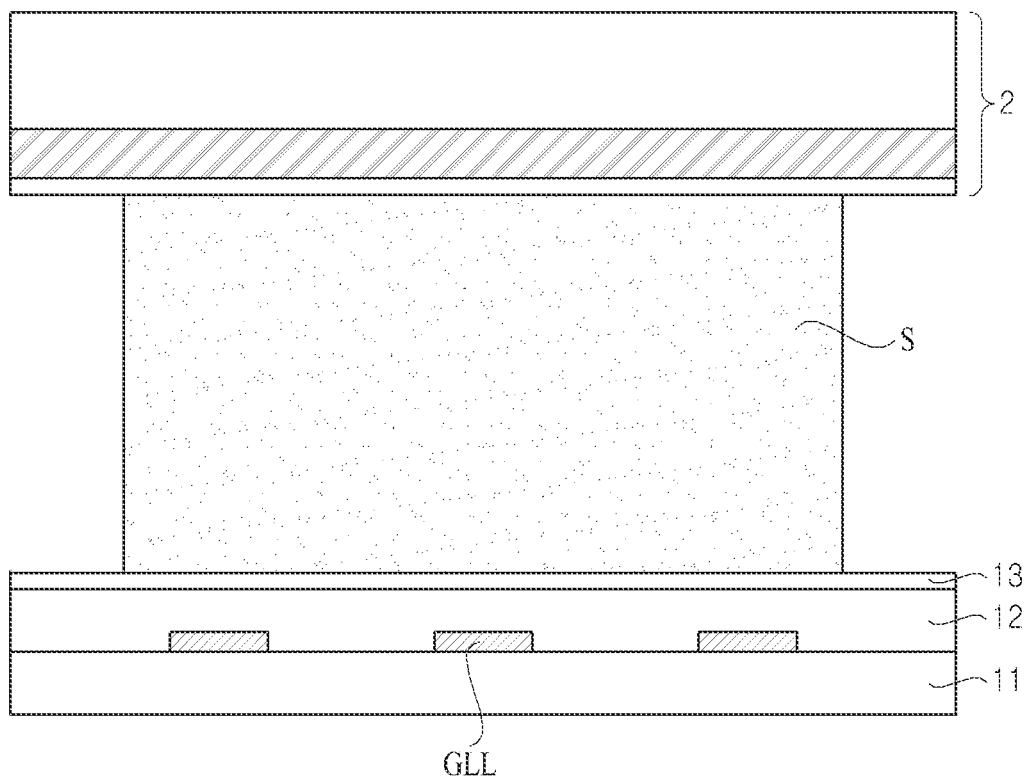
FIG. 2 is a sectional view illustrating an area A of FIG. 1.
Figure 3:
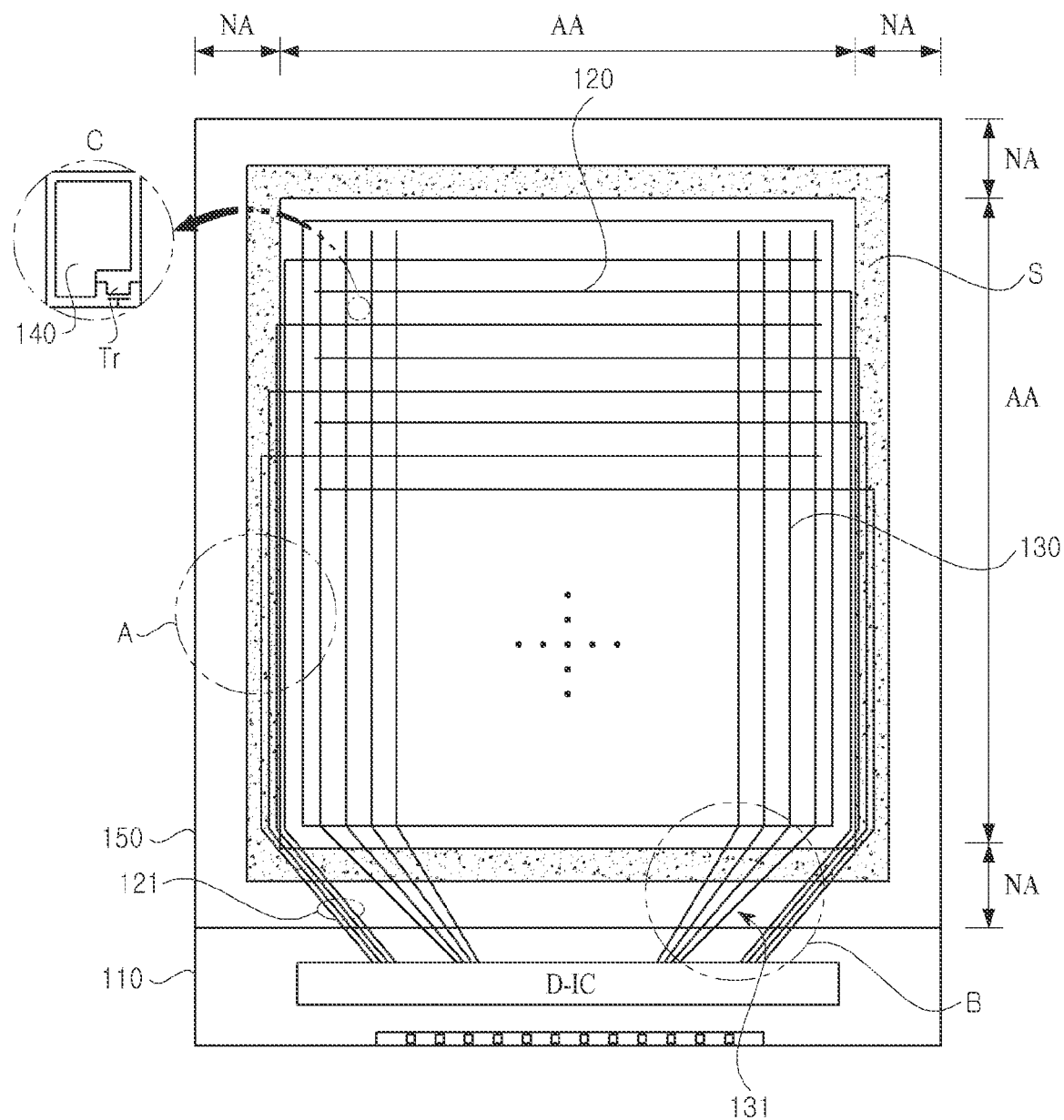
FIG. 3 is a plan view illustrating an array substrate according to one embodiment.

FIG. 3 is a plan view schematically illustrating a LCD device according to one embodiment.

As illustrated, the LCD device according to one embodiment includes an array substrate (lower substrate) 110 and a color filter substrate 150 that faces the array substrate 110 and is coupled to the array substrate 110.

Each of the array substrate 110 and color filter array substrate 150 may include an active area AA for displaying an image and an inactive area NA surrounding the active area AA. A space is formed between the array substrate 110 and the color filter substrate 150, and liquid crystal is injected into the space to form a liquid crystal layer (not shown). The array substrate 110, the color filter substrate 150, and the liquid crystal layer (not shown) formed therebetween are collectively called a LCD panel.

In FIG. 3, an area A indicates a gate link line area in the inactive area NA, an area B indicates a data link line area in the inactive area NA, and an area C indicates an enlarged unit pixel in the active area AA.

A black matrix (not shown) that prevents the leakage of light incident from a backlight unit (not shown) and a color filter layer (not shown) including a red, green, and blue color filter pattern of each unit pixel are formed at an inner plane toward the liquid crystal layer in the color filter substrate 150. The color filter layer is formed in the active area AA, and the black matrix is formed between the inactive area NA surrounding the active area AA and a unit pixel in the active area AA.

A plurality of gate lines 120 that are laterally arranged at equal intervals and receive a scan signal and a plurality of data lines 130 that are vertically arranged at equal intervals to perpendicularly intersect the gate lines 120 and define a plurality of pixels together with the gate lines 120 are disposed in the active area AA of the array substrate 110.

Data signals are applied through the respective data lines 130.

A thin film transistor Tr, which controls application of a data signal to a pixel electrode (140 in the area C) formed in each unit pixel, is formed at an intersection portion of a corresponding gate line 120 and data line 130 in the active area AA of the array substrate 110. The thin film transistor will be described below in more detail with reference to FIG. 4.

The thin film transistor Tr includes a gate electrode 203, a gate insulating layer (first insulating layer) 202, a semiconductor layer (not shown) configured with an active layer 204 and an ohmic contact layer (not shown), and a source electrode 205 and a drain electrode 206 which are separated from each other with the active layer 204 therebetween, which are sequentially stacked in structure.

Moreover, a passivation layer (second insulating layer) 207 that covers the thin film transistor Tr and exposes the drain electrode 206 and channel area CH of the thin film transistor Tr is formed in the array substrate 110. An organic protective layer 208 is further is formed on the passivation layer 207. Also, a pixel electrode 209 electrically connected to the drain electrode 206 is formed on the organic protective layer 208 through a contact hole (not shown).

In an embodiment of the thin film transistor Tr, due to features in a manufacturing method, each of the data line 130, the source electrode 205, and the drain electrode 206 is formed in a triple layer that includes the active layer 204 formed of a semiconductor material, the ohmic contact layer (not shown) whose conductivity has been enhanced by injecting impurities into the active layer 204, and a conductive metal layer that is a main element of the data line 130. In the data line 130, when seen as a plan view, only the conductive metal layer is viewed, but the ohmic contact layer and the active layer are further formed under the conductive metal layer. Also, like the data line 130, each of the source electrode 205 and the drain electrode 206 is also formed in a triple layer including the active layer 104, the ohmic contact layer (not shown), and the metal layer. This will be described below in a manufacturing method of the present invention, but due to the active layer being deposited on a substrate in a process of forming the data lines, formation of the ohmic contact layer and deposition of the metal layer for the data lines are sequentially performed, and the data lines are patterned by one mask process.

Therefore, in one embodiment, the source electrode 205 branches from the data line 130 into the unit pixel area and is integrated with the data line 130. Also, the active layer 204 is patterned simultaneously with source electrode 205 and the drain electrode 206, and thus, the source electrode 205 and the drain electrode 206 have the same line width.

Figure 4:
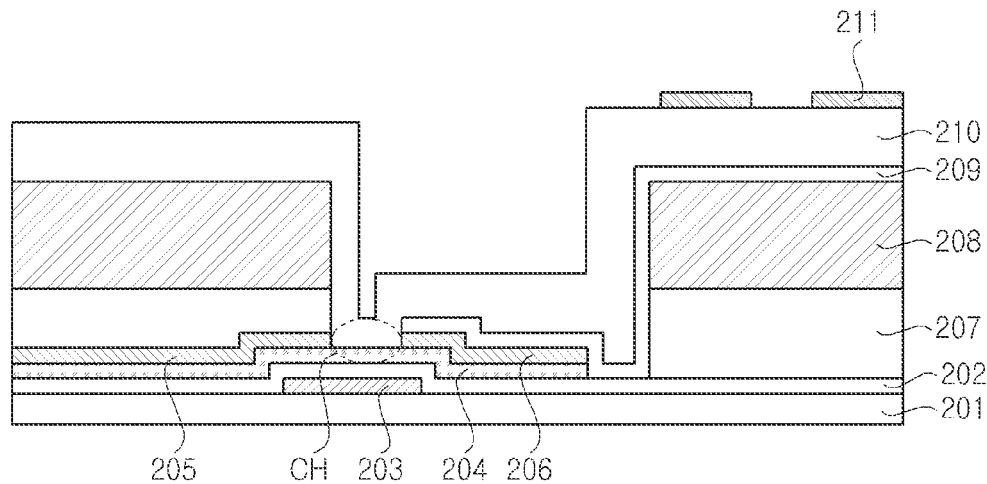
FIG. 4 is a sectional view illustrating a thin film transistor according to one embodiment.

As illustrated in FIG. 4, the ohmic contact layer (not shown) and the metal layer are removed from an area over the gate electrode 203, and only the active layer 204 is left, thereby forming a channel CH according to an embodiment of the present invention.

Moreover, in the embodiment, the organic protective layer 208 is further formed on the passivation layer 207. The organic protective layer 208 compensates for a step height due to the respective layers formed under the organic protective layer 208, and reduces crosstalk occurring between the data line 130 and the pixel electrode 209. The organic protective layer 208 of the present invention may use photoacryl that is a photosensitive organic material.

A third insulating layer 210 of an inorganic material for protecting the organic protective layer 208 is further formed on the organic protective layer 208. In the embodiment, the first to third insulating layers 202, 207, and 210 are insulating layers of inorganic materials, and may be formed of silicon oxide ($SiO_2$) or silicon nitride ($SiNx$).

The third insulating layer 210 is further formed on the organic protective layer 208, and directly contacts the first insulating layer 202 inside the contact hole (not shown). In this case, since material layers having the same properties contact each other, adhesive ability between the first and third insulating layers 202 and 210 can be enhanced.

Furthermore, the common electrode 211 that generates a lateral electric field together with the pixel electrode 209 inside the unit pixel is further formed on the third insulating layer 210. Therefore, the third insulating layer 210 insulates the pixel electrode 209 from the common electrode 211.

A driver IC D-IC which supplies the scan signal to the gate line 120 and supplies a data signal to the data line 130, is disposed in the inactive area NA according to the embodiment. Also, a gate link line 121 and a data link line 131 that respectively supplies signals generated by the driver IC D-IC to the gate line 120 and the data line 130 are further formed in plurality in the inactive area NA. Therefore, the driver IC D-IC is connected to the gate line 120 by the gate link line 121, and connected to the data line 130 by the data link line 131. In FIG. 3, the area A illustrates an area in which the gate link line 121 is formed, and the area B illustrates an area in which the data link line 131 is formed.

A structure of one embodiment of a link part will now be described in more detail with reference to FIGS. 5A and 5B.

Figure 5A:
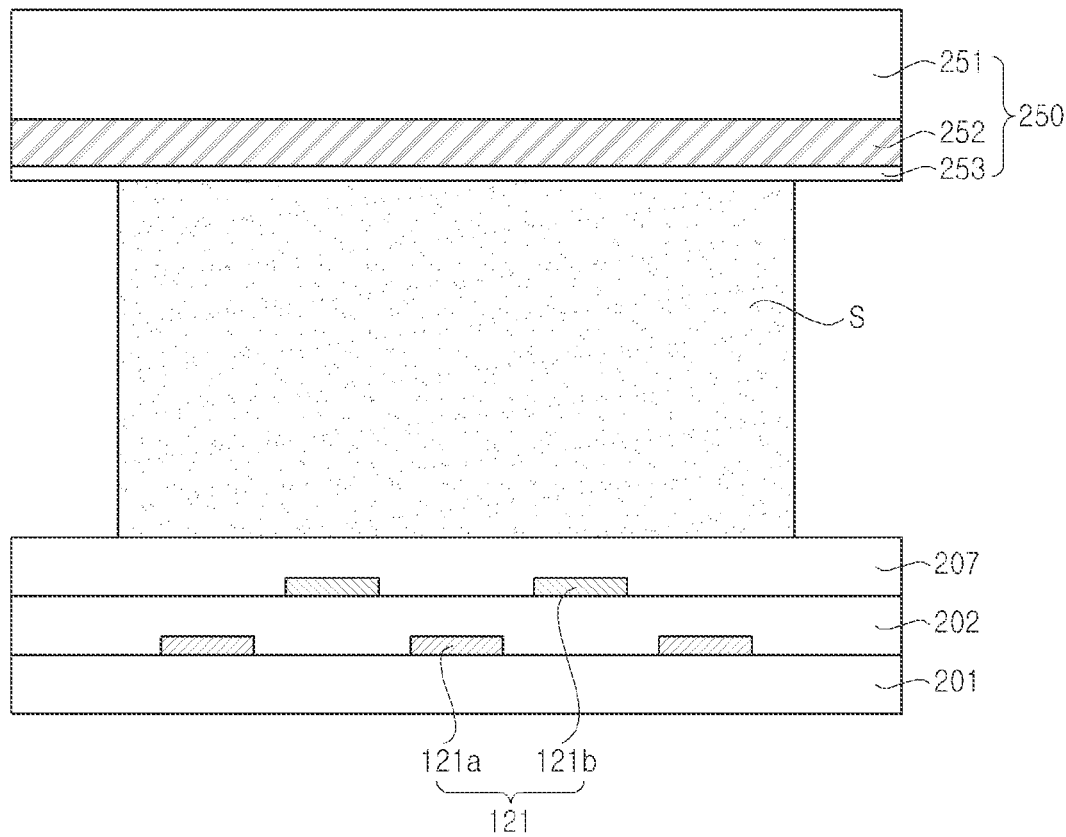
FIGS. 5A and 5B are sectional views illustrating a link part according to one embodiment.

FIG. 5A illustrates a sectional view of the area A of FIG. 3, namely, a gate link area in which the gate link line 121 is formed in plurality. FIG. 5B is a sectional view illustrating in more detail the sectional view of gate link area. In the embodiment, the gate link line 121 in the area A (gate link area) and the data link line 131 in the area B (data link area) have the same sectional structure, and thus, only the gate link area will be described below. Also, in the following description, the gate link line 121 is simply referred to as a link line 121.

Figure 5B:
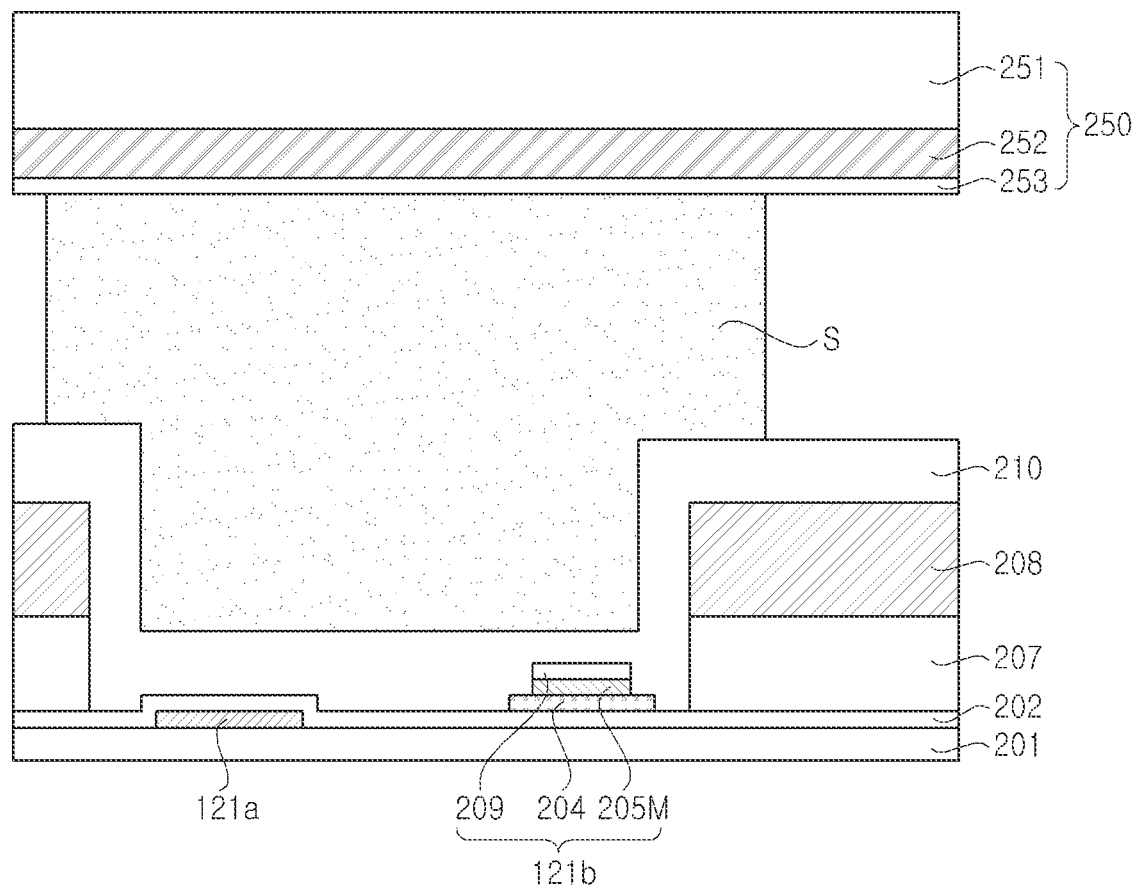

Referring to FIGS. 5A and 5B, the link line 121 includes a first link line 121a formed on a first substrate 201 and a second link line 121b formed on the first insulating layer 202. A plurality of the first and second link lines 121a and 121b are alternately disposed such that each first link line 121a does not horizontally overlap with a second link line 121B. Specifically, when odd-numbered link lines are referred to as the first link lines and even-numbered link lines are referred to as the second link lines, the odd-numbered link lines are formed on the first substrate 210, and the even-numbered link lines are formed on the first insulating layer 202. The first substrate 201 is a general glass substrate, and the first gate insulating layer 202 is a gate insulating layer formed of silicon oxide or silicon nitride.

Accordingly, since the gate insulating layer 202 is disposed between the first and second link lines 121a and 121b, the first and second link lines 121a and 121b can be disposed closely to each other without an electrical short circuit. As a result, more link lines are disposed in each unit area, and can reduce the area of the inactive area in which the link lines are formed, thus realizing a narrow bezel. As shown in FIG. 5A, the passivation layer 207 is formed on the second link lines 121b. A seal pattern S couples the passivation layer 207 to an upper substrate 250. In one embodiment, the upper substrate 250 includes a second substrate 251, a color filter layer 252, and an alignment (orientation) layer 253.

To provide a description on a link line structure according to the embodiment with reference to FIG. 5B, the second link line 121b is formed on the first insulating layer 202 and characterized by having a multi-layer structure. Specifically, the second link line 121b is formed by sequentially stacking the active layer 204, the ohmic contact layer (not shown), a source metal layer 205M, and a transparent electrode layer 209.

The following description will be made in the manufacturing method according to the embodiment, but, since the second link line 121b is formed simultaneously with the channel in a process of forming the channel, the second link line 121b has a width of the active layer that is broader than that of each of the ohmic contact layer, the source metal layer 205M, and the transparent electrode layer 209 formed on the active layer 204. In other words, the ohmic contact layer, source metal layer 205M, and transparent electrode layer 209 configuring the second link line 121b in the link area have the same width, which is narrower than the width of the active layer 204.

The active layer 204 and the ohmic contact layer are respectively formed of the same materials as those of the active layer 204 and the ohmic contact layer forming the thin film transistor. The source metal layer 205M is formed of the same metal as the metal layer configuring the data line, the source electrode 205, and the drain electrode 206.

Moreover, the transparent electrode layer 209 is formed as a transparent conductive layer equal to the conductive layer configuring the pixel electrode.

The second link line 121b is formed in multiple layers because the link line is formed simultaneously with the forming of the channel of the thin film transistor.

Referring to FIG. 5B, in the embodiment, the organic protective layer 208 has been removed from the link area in which the link line is formed. That is, the organic protective layer 208 is formed across a length of the first substrate 201, but has been removed from a channel area with the channel formed therein and a link area with the link line formed therein as illustrated in FIGS. 4 and 5B. This is for preventing the organic protective layer 208 from being separated from an insulating layer formed of an inorganic material because adhesive strength between the organic protective layer 208 and the insulating layer is weak. Specifically, if the organic protective layer 208 is left in the link area and the channel area, the organic protective layer 208 is adhered to the second and third insulating layers 207 and 210 formed of organic materials, but, since the organic protective layer 208 formed of an organic material has properties different from the second and third insulating layers 207 and 210 formed of organic materials, partial detachment therebetween occurs due to weak adhesive strength. To prevent such a limitation and enhance an adhesive characteristic, the organic protective layer 208 is removed from the channel area and the link area. As a result, referring to FIG. 5B, the organic protective layer 208 is removed from the link area, and the organic protective layer 208 is left in the other area that does not include the link line.

Figure 5C:
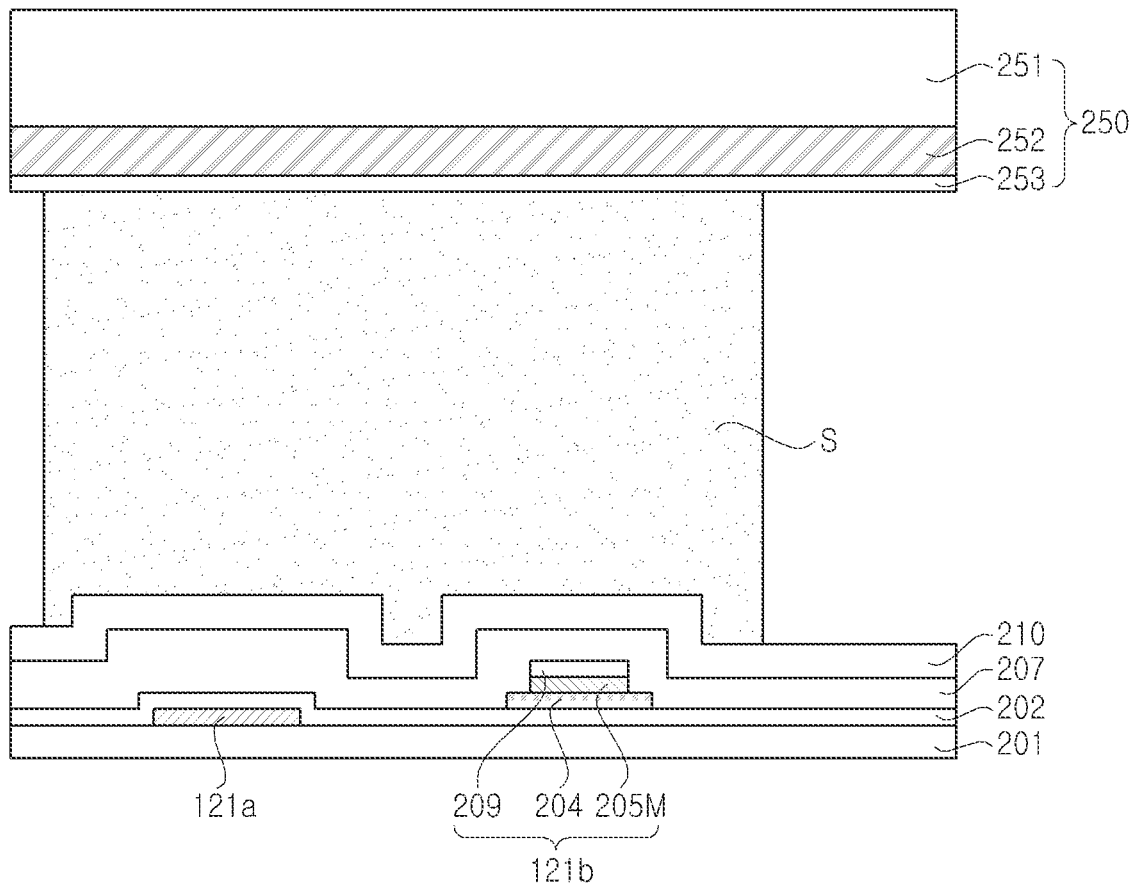
FIG. 5C is a sectional view illustrating a link part according to another embodiment.

FIG. 5C illustrates another embodiment of the present invention. The embodiment of FIG. 5C illustrates a case in which the organic protective layer 208 is not provided on the second insulating layer 207. In this case, the second insulating layer 207 is formed on the first insulating layer 202, and the third insulating layer 210 is formed on the second insulating layer 207. Since the organic protective layer 208 is not provided, an adhesive characteristic between the organic protective layer 208 and the insulating layer is not degraded.

Hereinafter, a method of manufacturing a LCD device according to a first embodiment will be described with reference to FIGS. 6A to 6J.

Figure 6A:
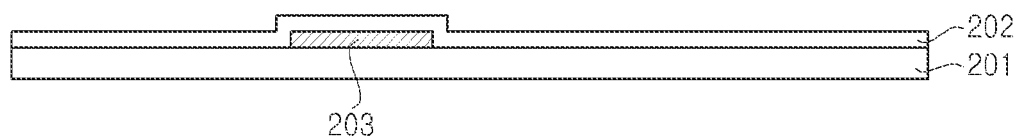
FIGS. 6A to 6J are sequence views illustrating a method of manufacturing an array substrate according to one embodiment.

FIGS. 6A to 6J are sequence views illustrating a method of manufacturing a thin film transistor in the active area AA, according to one embodiment. FIGS. 6AA to 6JJ are sequence views illustrating a process of forming a link line in the link area of the inactive area NA.

In each process, by one mask process, an arbitrary layer of the thin film transistor in the active area AA is formed and simultaneously an arbitrary layer of the link line in the link area of the inactive area NA is formed. Therefore, the thin film transistor is illustrated as a representative example of the active area, and the link line is illustrated as a representative example of the inactive area.

A link line is generally configured with a gate link line and a data link line. However, in the embodiment, since each of the gate link line and the data link line has a dual link structure, FIGS. 6AA to 6CC illustrate only a data link line area.

Referring to FIG. 6A and FIG. 6AA, the first substrate 201 such as a transparent glass is prepared. A plurality of unit LCD panels may be formed on one substrate, in which case the first substrate 201 may be called a mother substrate. In the embodiment, one unit LCD panel will be described as an example. However, when a plurality of unit LCD panels are formed on one mother substrate, all of the unit LCD panels undergo the same process.

A gate metal material is deposited on the first substrate 201. In the embodiment, the gate metal material is a conductive metal material, and may use copper (Cu), aluminum (Al), molybdenum (Mo), molybdenum titanium (MoTi) alloy, or a multi layer in which the metals are stacked in combination. The gate metal material is deposited over the first substrate 201. Deposition may be performed by a sputtering process of metal.

Subsequently, a first mask (not shown) is aligned on the gate metal material layer, and the gate line and the gate electrode 203 are formed through a photolithography process. Simultaneously, in the first mask process, the first link line 121a is patterned in the inactive area NA. Therefore, the gate line (not shown), the gate electrode 203, the first link line 121a are formed of the same conductive material.

The photolithography process denotes a series of processes including: an operation that coats photoresist on the deposited gate metal layer; an operation that aligns a plurality of the first masks on the photoresist layer and exposes the photoresist layer; an operation that develops the exposed photoresist layer to form a photoresist pattern; an operation that etches the gate metal layer by using the photoresist pattern as an etch blocking mask; and an operation that strips the photoresist pattern. Also, a process of from the operation (which coats the photoresist on the substrate with one mask) to the operation of stripping the photoresist is called one mask process.

Thus, the gate line, the gate electrode, and the first link line are formed through the first mask process.

Subsequently, the gate insulating layer (first gate insulating layer 202) that covers the gate line, the gate electrode, and the first link line is formed. The first gate insulating layer 202 is necessary for insulating metal patterns thereunder. The first insulating layer 202 is formed by depositing silicon oxide ($SiO_2$).

Figure 6B:
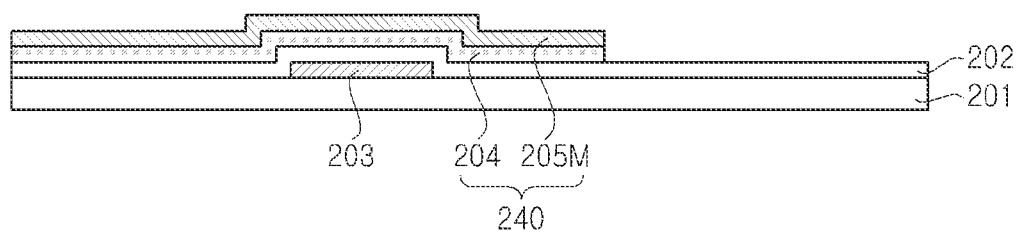

Referring to FIGS. 6B and 6BB, a semiconductor material intended to configure an active pattern 204 is deposited on the first substrate 201 with the gate electrode 203 and first link line 121a formed therein. The semiconductor material layer, in more detail, includes an active layer in which group 3 and group 5 impurity ions are injected into a semiconductor material such as amorphous silicon or polycrystalline silicon, and an ohmic contact layer in which a work function value with the metal layer is reduced by further injecting an impurity ion into a surface of the active layer and thus an ohmic-contact characteristic is enhanced. Accordingly, the semiconductor material layer may be configured with the active layer 204 and the ohmic contact layer formed on the active layer 204.

When forming an n-type semiconductor, the active layer 204 is formed by injecting a group 3 element to an intrinsic semiconductor. When forming a p-type semiconductor, the active layer 204 is formed by injecting a group 5 element, such as phosphorous (P), to an intrinsic semiconductor.

Subsequently, the source metal layer 205M is deposited on the first substrate 201 with the active layer 204 and ohmic contact layer formed therein. The source metal layer 205M is a conductive metal layer configuring the data line, the source electrode, and the drain electrode. Also, the source metal layer 205M configures the second link line 121b.

The source metal layer 205M may use conductive Mo, MoTi, and Al. In the embodiment, the source metal layer 205M uses Mo.

As described above in the process, the active layer 204, the ohmic contact layer (not shown), and the source metal layer 205M are formed through a successive deposition process. That is, the layers may be successively formed inside a deposition chamber.

Subsequently, referring to FIGS. 6B and 6BB, a second mask process is performed for forming a channel pattern 240 for formation of the thin film transistor and the second link line 121b. The second mask includes a data line (not shown), a later channel, the channel pattern 240 protruding from the data line to a pixel area, and a plurality of patterns defining the second link line 121b.

The second mask process using the second mask is performed through a photolithography process. Specifically, the second mask process includes: a process that coats photoresist on the source metal layer 205M; a process that aligns a plurality of the second masks on the photoresist; a process that exposes the photoresist by using each of the second masks as a blocking mask; a process that develops the exposed photoresist to form a photoresist pattern; a process that performs etching by using the photoresist pattern as the blocking mask; and a process that strips the photoresist pattern.

In the etching process, the source metal layer 205M, ohmic contact layer (not shown), and active layer 204 under the photoresist are sequentially etched by using the photoresist pattern as the blocking mask. The source metal layer 205M is formed by wet etching with an etchant, and the ohmic contact layer and the active layer 204 are formed by dry etching.

As a result, as illustrated in FIGS. 6B and 6BB, the channel pattern 240 in which the active layer 204, the ohmic contact layer (not shown), and the source metal layer 205M are sequentially stacked is completely formed.

The second link line 121b, which are formed by sequentially stacking the active layer 204, the ohmic contact layer (not shown), and the source metal layer 205M, is formed in the inactive area.

In the etching process, since wet etching and dry etching are successively performed by using the photoresist pattern as the blocking mask for etching, the active layer 204 and the source metal layer 205M do not include a step height therebetween, and both the active layer 204 and the source metal layer 205M include only one step height.

Subsequently, referring to FIGS. 6C and 6CC, the channel pattern 240 and the second link line 121b are formed, and then the second insulating layer 207 covering the channel pattern 240 and the second link line 121b is deposited on the first insulating layer 202. The second insulating layer 207 protects and insulates the channel pattern 240 and the second link line 121b against the outside. The second insulating layer 207 may use the same material as the first insulating layer 202. For example, the second insulating layer 207 may use silicon nitride or silicon oxide.

In the first and second insulating layers 202 and 207, an adhesive characteristic is enhanced after deposition by using inorganic materials having physically similar properties.

Subsequently, referring to FIGS. 6D and 6DD, the organic protective layer 208 having photosensitivity is coated on the second insulating layer 207. The organic protective layer 208, for example, may use a photoacryl resin. The organic protective layer 208, a photosensitive organic layer, is formed on the second insulating layer 207, and prevents crosstalk due to a parasitic capacitance generated between the pixel electrode 209 and the data line which are formed subsequently thereto. Also, the organic protective layer 208 compensates for a step height of a substrate due to the layers thereunder. That is, the organic protective layer 208 compensates for a height step of a substrate surface due to the gate electrode 203 and the channel pattern 240, and planarizes the surface.

In the embodiment, the organic protective layer 208 uses a photosensitive organic protective layer having a positive type in which an exposed area is removed by stripping.

Subsequently, a plurality of masks M in which the channel area 220 and the link line area 230 are patterned are aligned on the organic protective layer 208, which is exposed and developed. As a result, a pattern of the organic protective layer 208 in which the channel area and the link line area are exposed is formed. The second insulating layer 207 is etched by using the pattern of the organic protective layer 208 as the blocking mask for etching. Since the second insulating layer 207 is an inorganic layer, the second insulating layer 207 is etched by a general dry etching process.

Figure 6C:
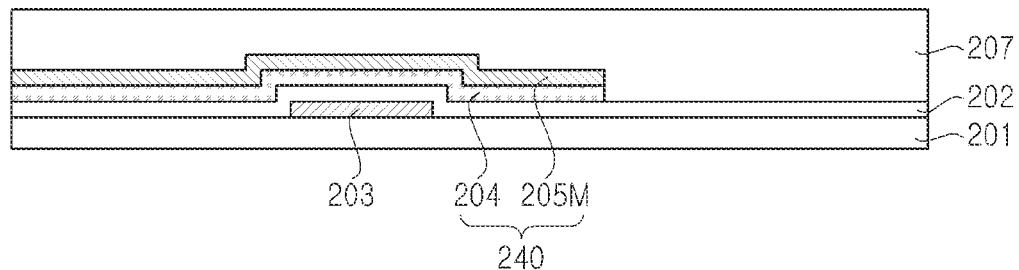
Figure 6A:
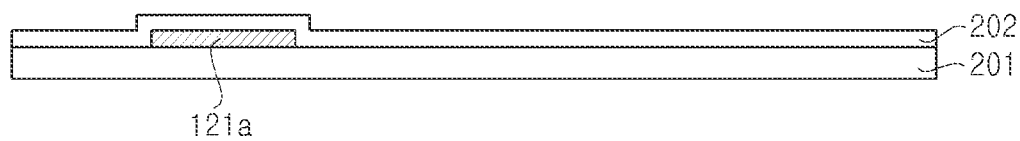
Figure 6B:
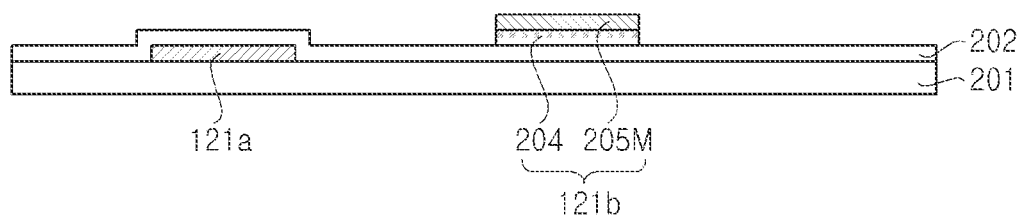
Figure 6C:
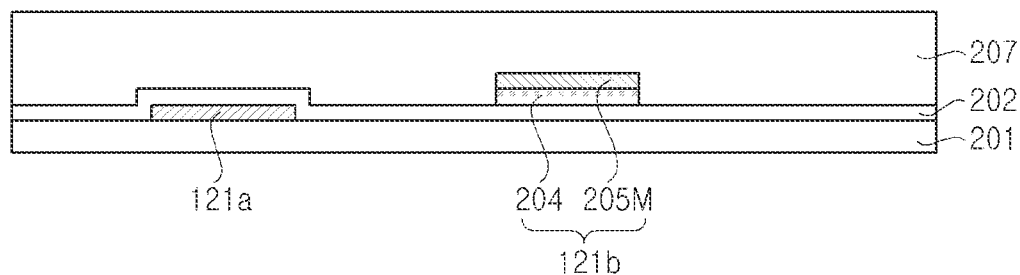
Figure 6D:
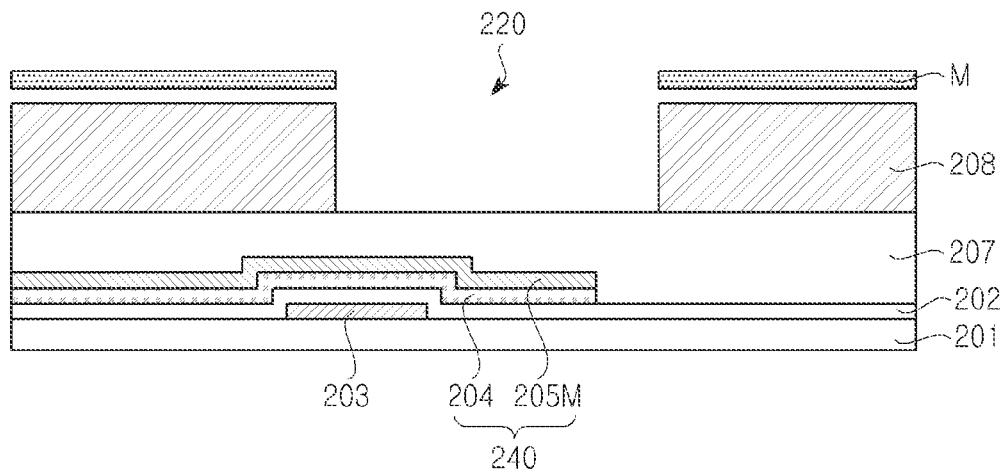
Figure 6E:
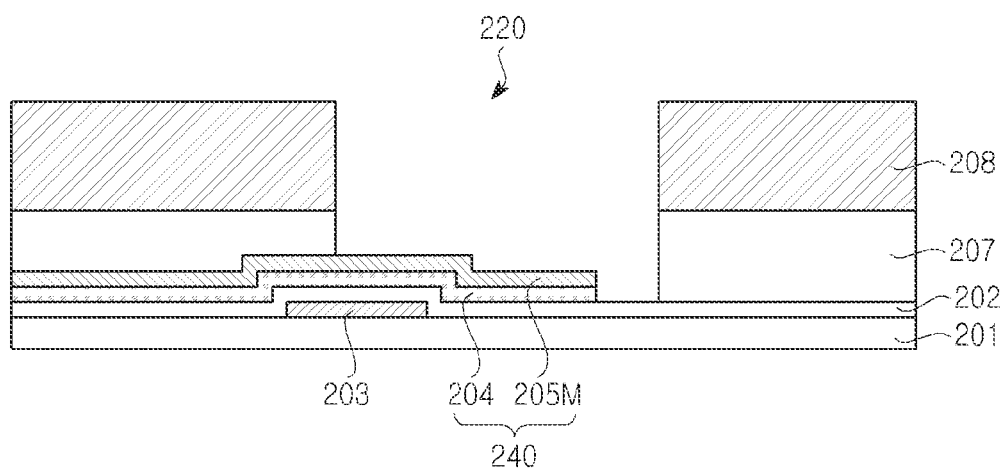

As a result, as illustrated in FIGS. 6E and 6EE, a source electrode metal 205M is exposed in the channel area 220 and the link line area 230.

Figure 6F:
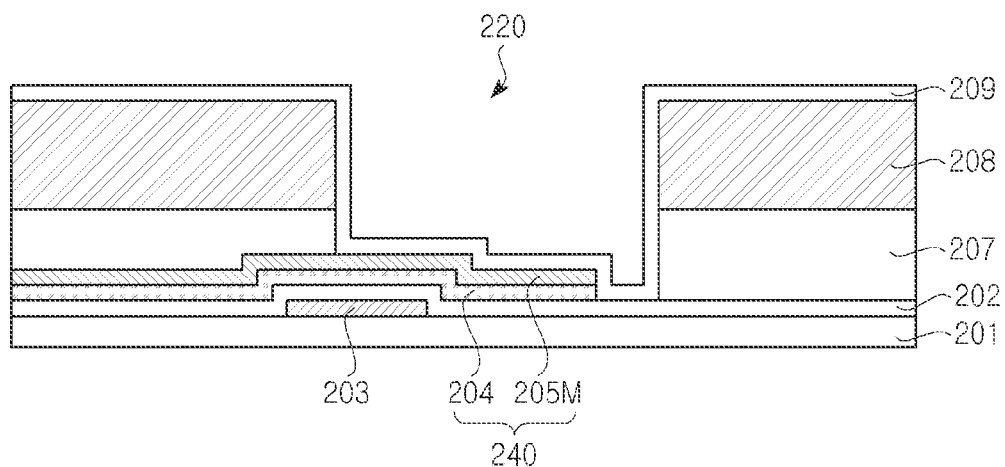
Figure 6D:
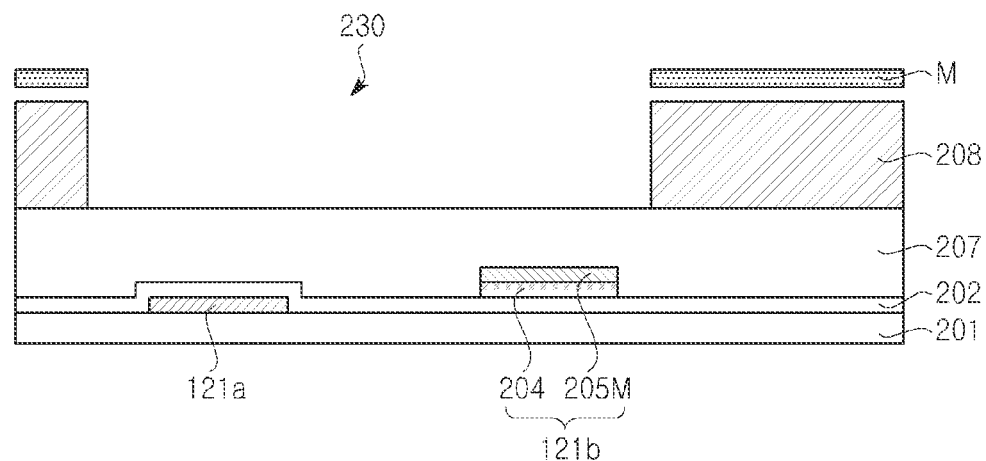
Figure 6E:
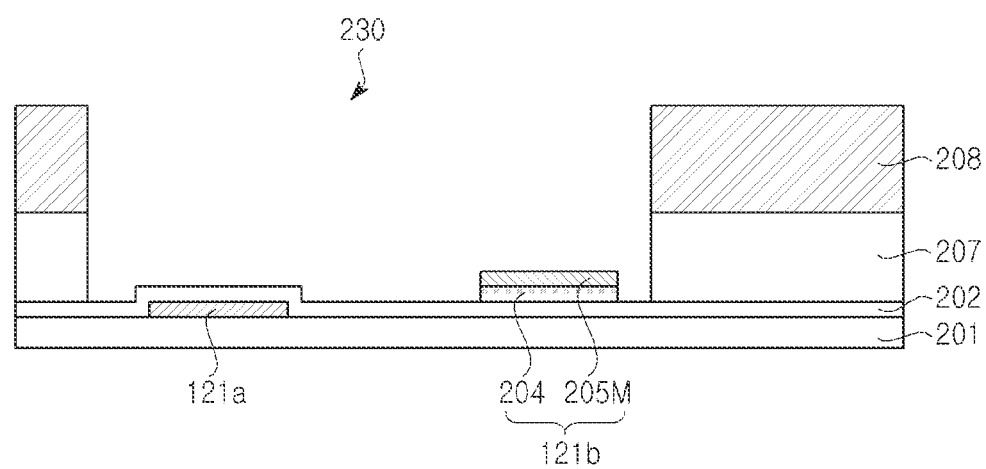
Figure 6F:
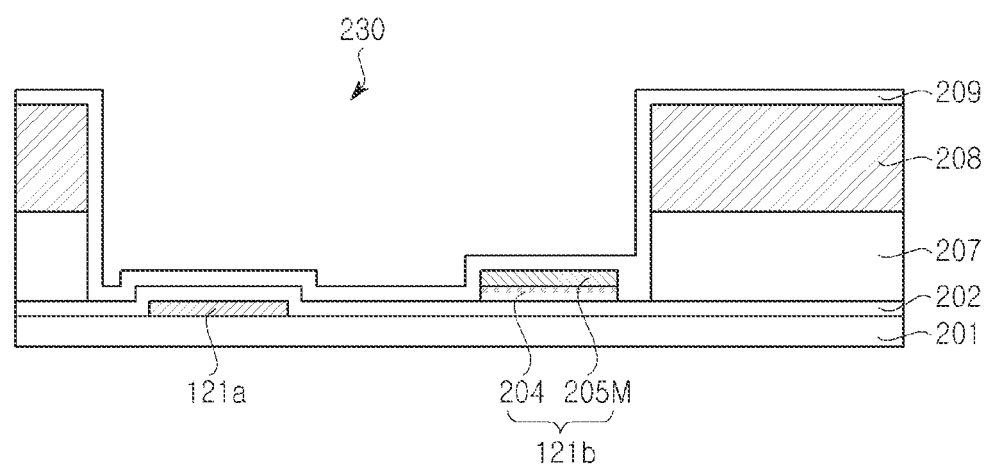

Subsequently, referring to FIGS. 6F and 6FF, with the source electrode metal 205M being exposed in the channel area and the link line area, a transparent electrode material is deposited all over the first substrate 201. The transparent electrode material may be indium tin oxide (ITO) or indium zinc oxide (IZO). The transparent electrode material is patterned and then becomes the pixel electrode 209. Especially, the transparent electrode material is deposited on and electrically connected to the source electrode metal layer 205M in the channel area 220.

Subsequently, referring to FIGS. 6G and 6GG, a photoresist pattern is further formed on the deposited transparent material layer. The photoresist pattern includes a first photoresist pattern PR1 for patterning the pixel electrode 209 and a second photoresist pattern PR2 for patterning the second link line 121*b*.

Moreover, the second photoresist pattern PR2 defines an area in which a channel is formed and a size of the channel.

Figure 6G:
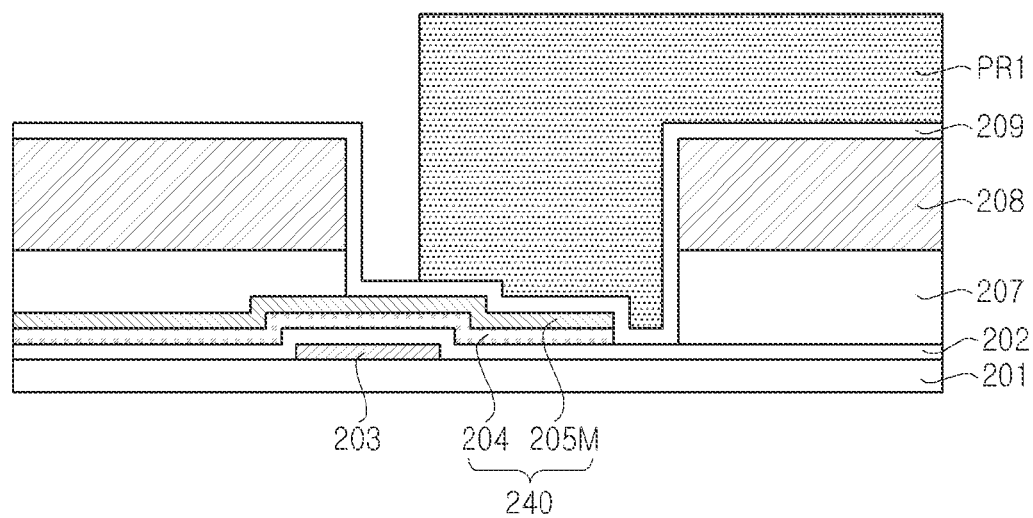

Especially, the second photoresist pattern PR2 is designed to decide a line width of the second link line 121*b*, and designed less than the line width of the patterned second link line patterned as illustrated in FIG. 6GG. The reason will now be described in more detail.

Although the exposure equipment is precise, misalignment occurs by a certain degree in a process of forming the photoresist pattern. For example, a line width of 5μm of a link line is assumed to be formed. When the line width of the patterned second link line 121*b* patterned as illustrated in FIG. 6GG is 5μm, misalignment occurs in exposure, and thus, when the second photoresist pattern overlaps the second link line 121*b* by a width of 3μm and deviates from the width of the second link line 121*b* by a width of 2μm, the transparent electrode material exposed by the misalignment of the second photoresist pattern PR2 and the source electrode metal 205M thereunder are etched and removed in etching using the second photoresist pattern PR2 as an etching blocking mask. In this case, the line width of the second link line 121*b* is merely 3μm, and thus, a line width of a link line according to a design cannot be obtained.

On the other hand, when the line width of the second link line 121*b* illustrated in FIG. 6GG is designed to have a line width of 7 to 8μm and the second photoresist pattern PR2 having a line width of 5μm is formed, even if an alignment error of the exposure equipment occurs, the second photoresist pattern PR2 is completely formed on the second link line 121*b*, and thus, after etching, the second link line 121*b* having a line width of 5μm is formed.

That is, in the embodiment, when the line width of the second link line 121*b* formed in forming the channel pattern 240 is designed greater than an actually desired line width of a link line and the second photoresist pattern PR2 is formed by the actually designed line width of the second link line 121*b*, even if misalignment of the exposure equipment occurs, the second photoresist pattern PR2 is formed on the second link line 121*b*, thus preventing a patterning defect of a link line due to the misalignment of the exposure equipment.

A manufacturing process according to the embodiment will now be described with further reference to FIGS. 6G and 6GG.

Figure 6H:
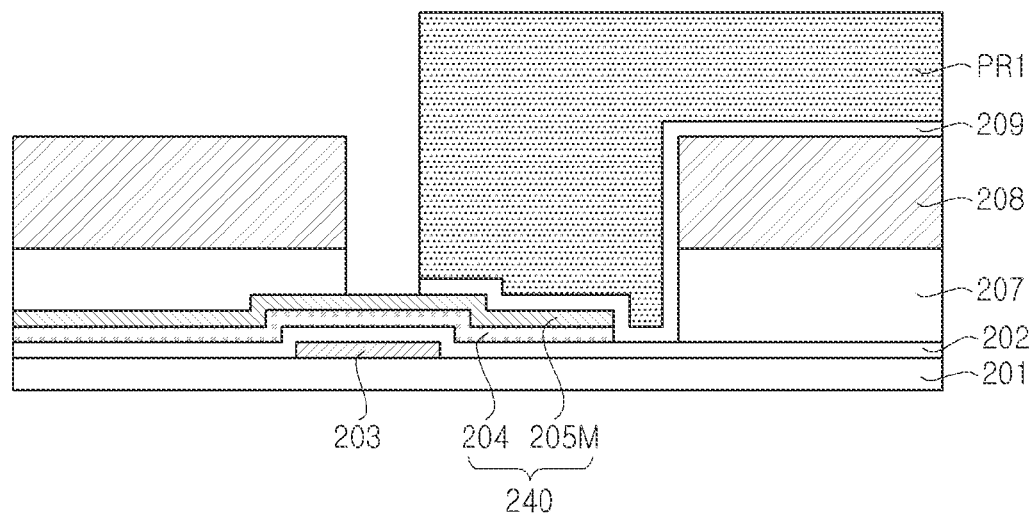
Figure 6G:
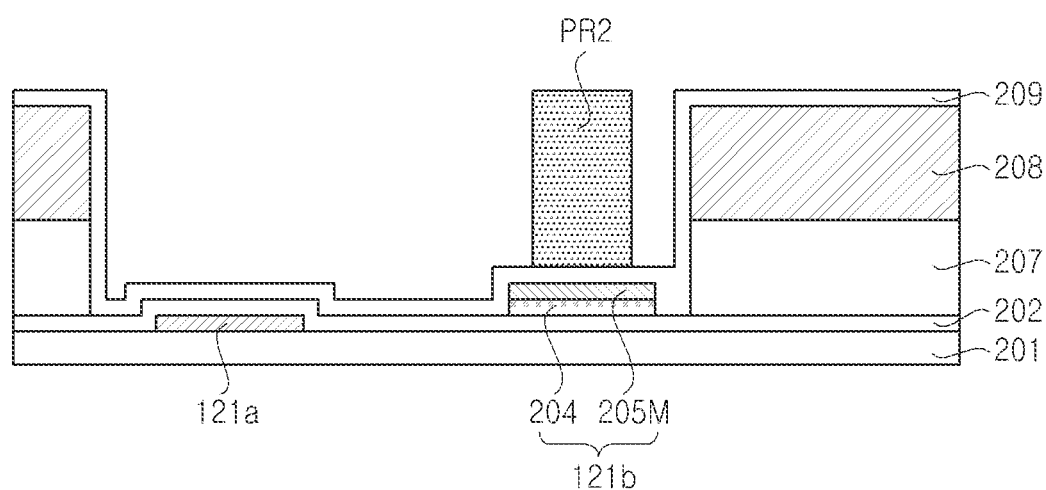
Figure 6H:
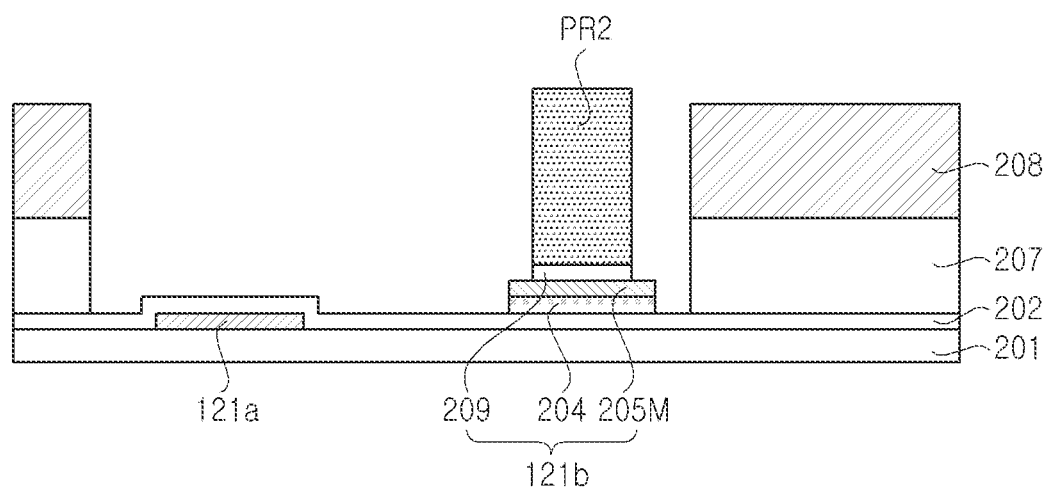

The first photoresist pattern PR1 defines the pixel electrode 209, and the second photoresist pattern PR2 defines the second link line 121*b*. The transparent electrode material layer is etched by using the first and second photoresist patterns PR1 and PR2 as the blocking masks for etching. In the etching, the transparent electrode material layer is etched through wet etching. In this case, a portion of the transparent electrode material layer uncovered by the first and second photoresist patterns PR1 and PR2 is etched and removed. Accordingly, a transparent electrode material (uncovered by the photoresist pattern) in the channel area and a transparent electrode material (uncovered by the photoresist pattern) in the link area are removed. This is illustrated in FIGS. 6H and 6HH.

Figure 6I:
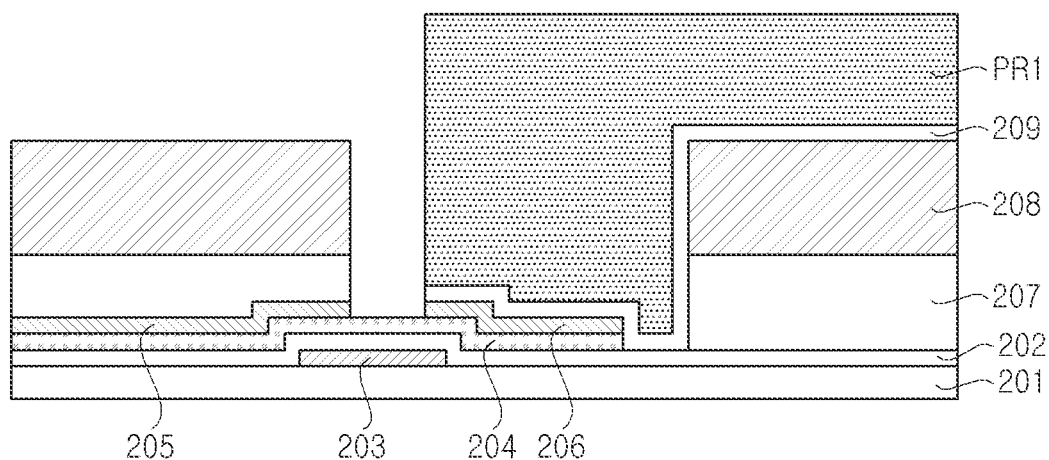

Subsequently, with the first and second photoresist patterns PR1 and PR2 being maintained as-is, the source electrode metal 205M is etched. In the etching, the source electrode metal 205M is etched through wet etching. Then, after the source electrode metal 205M is wet etched, the ohmic contact layer (not shown) is removed by dry etching, thereby completely forming the channel. That is, the transparent electrode material, source electrode metal, and ohmic contact layer in the channel area are sequentially etched by using the first and second photoresist patterns PR1 and PR2 as the etching blocking masks, and thus, the active layer 204 in the channel area is exposed, and the source electrode 205 and the drain electrode 206 are separated from each other. In FIG. 6I, it can be seen that the source electrode 205 has been separated from the drain electrode 206.

In the link area, a transparent electrode material, a source electrode metal, and an ohmic contact layer under the second photoresist pattern PR2 are sequentially etched by using the second photoresist pattern PR2 as an etching blocking mask. The transparent electrode material, the source electrode metal, and the ohmic contact layer are etched simultaneously with an etching process that is performed in an operation of forming the channel as illustrated in FIG. 4.

As a result, as illustrated in FIG. 6II, in the second link line 121*b*, the width of the active layer 204 is formed broader than that of each of the source metal layer 205M and a transparent electrode material layer 209, and thus, the line width of the source metal layer 205M is the same as that of the transparent electrode material layer 209.

Figure 6J:
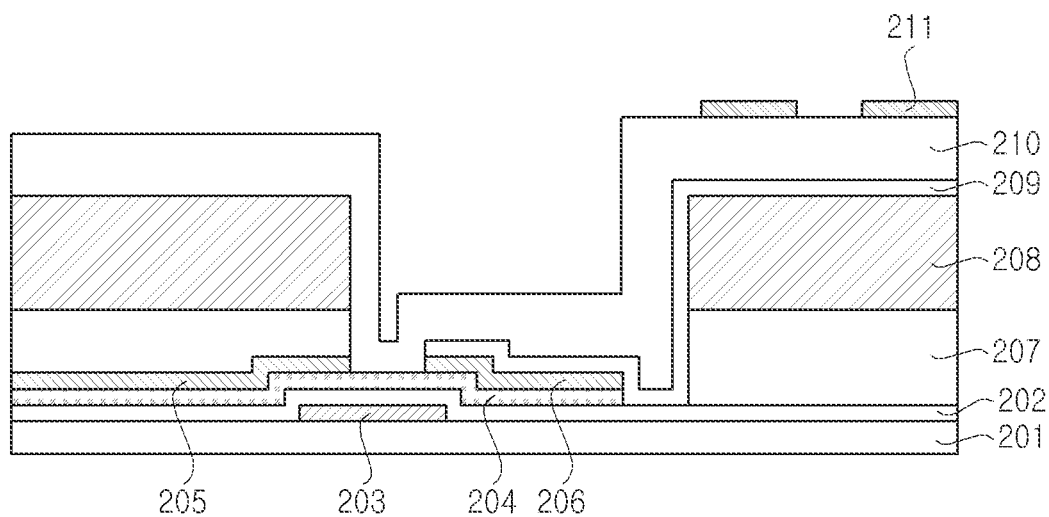
Figure 6I:
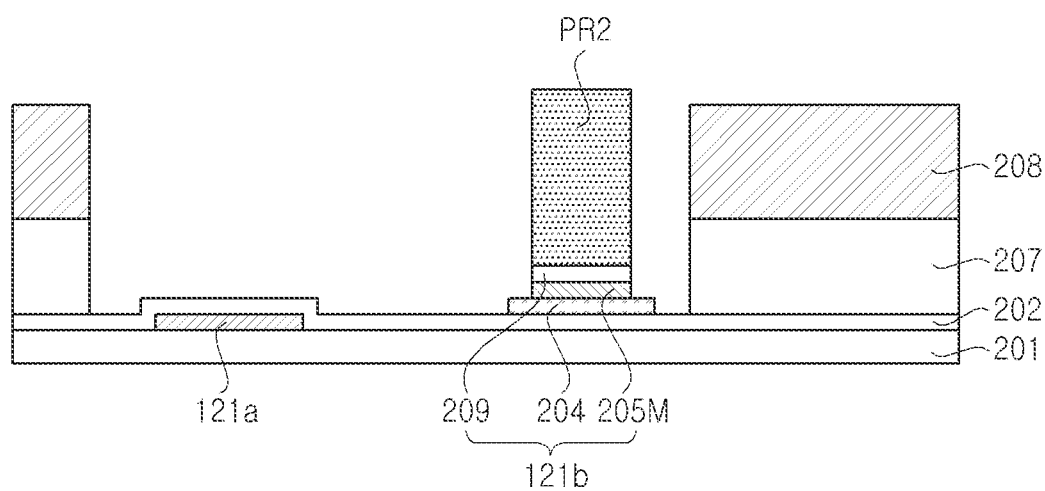
Figure 6J:
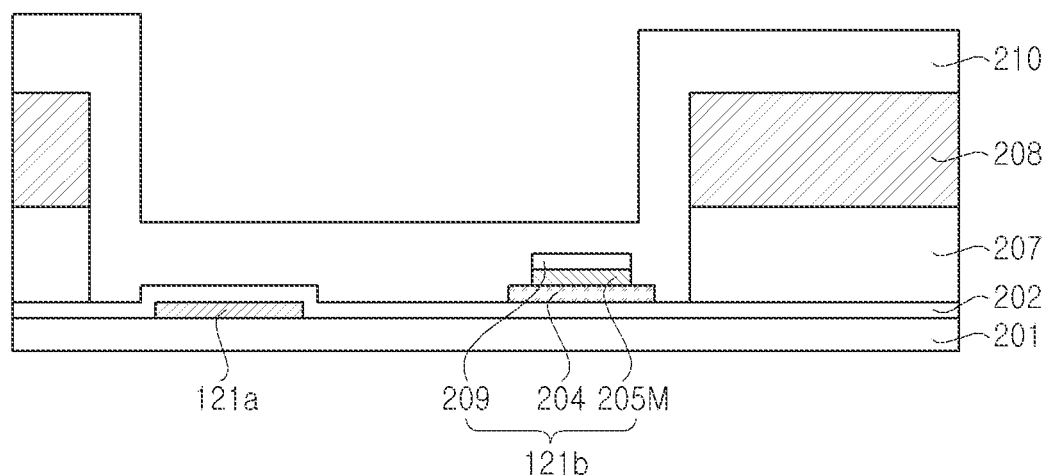

Subsequently, the first and second photoresist patterns PR1 and PR2 are stripped and removed, and then, as illustrated in FIGS. 6J and 6JJ, the third insulating layer 210 is deposited over the length of the first substrate 201. The third insulating layer 210 may be formed as an inorganic layer, and may be a silicon oxide layer or a silicon nitride layer. The third insulating layer 210 protects the pixel electrode 209 and the second link line 121*b*, and insulates the common electrode 211 and pixel electrode 209 to be formed on the third insulating layer 210.

Subsequently, referring to FIGS. 6J, the common electrode 211 is formed on the third insulating layer 210. One mask process is used in an operation of forming the common electrode 211. A lateral electric field is generated between the common electrode 211 and the pixel electrode 209, and drives the liquid crystal.

The array substrate according to the embodiment is finished through the process. Subsequently, the LCD panel is finished by coupling the color filter substrate and the array substrate (which are manufactured separately) with a seal pattern.

In the first embodiment of the present invention, a fringe field switching (FFS) mode or an in plane switching (IPS) mode which generates a lateral electric field has been described above, in which case a total of six mask processes are used. Specifically, the gate electrode, the gate line, and the first link line are formed by using a first mask, the channel pattern and the second link line are formed by using a second mask, the second insulating layer in the channel area and the link area is exposed by using a third mask, the channel and the pixel electrode are formed by using a fourth mask, a contact hole for a gate pad and a data pad is formed by using a fifth mask, and the common electrode is formed by using a sixth mask.

In the first embodiment, a case including the organic protective layer has been described above, but the organic protective layer may not be provided. Hereinafter, a second embodiment of the present invention will be described with reference to FIGS. 7A to 7I.

<Second Embodiment>

Figure 7A:
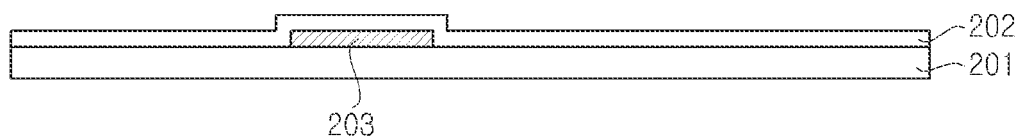
FIGS. 7A to 7I are sequence views illustrating a method of manufacturing an array substrate according to another embodiment of the present invention.
Figure 7B:
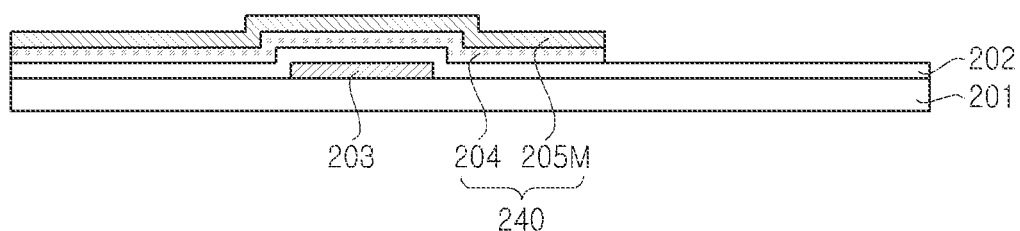
Figure 7C:
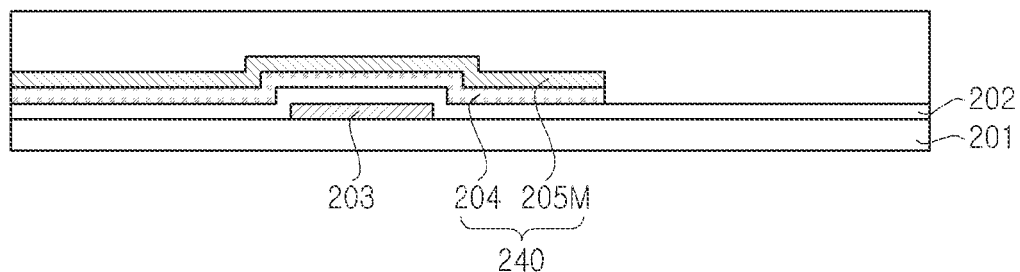
Figure 7A:
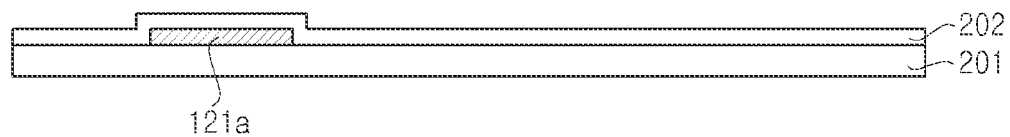
Figure 7B:
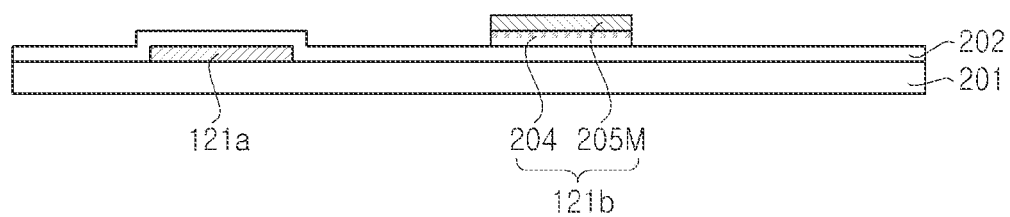
Figure 7C:
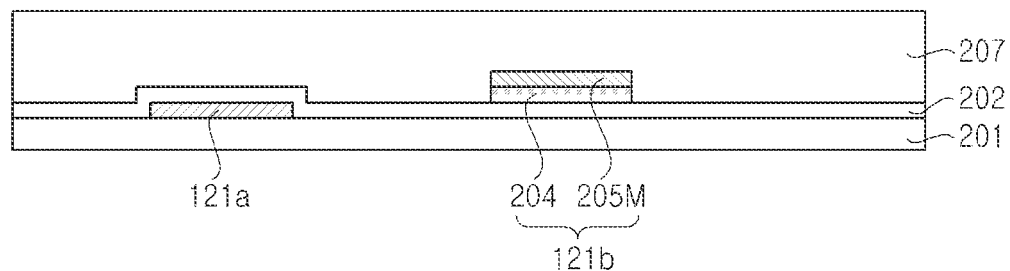

Referring to FIGS. 7A to 7C and FIGS. 7AA to 7CC, FIGS. 7A to 7C and FIGS. 7AA to 7CC are the same as the first and second mask processes of the first embodiment described with respect to FIGS. 6A to 6C and FIGS. 6AA to 6CC respectively, and thus, their description is not provided.

Figure 7D:
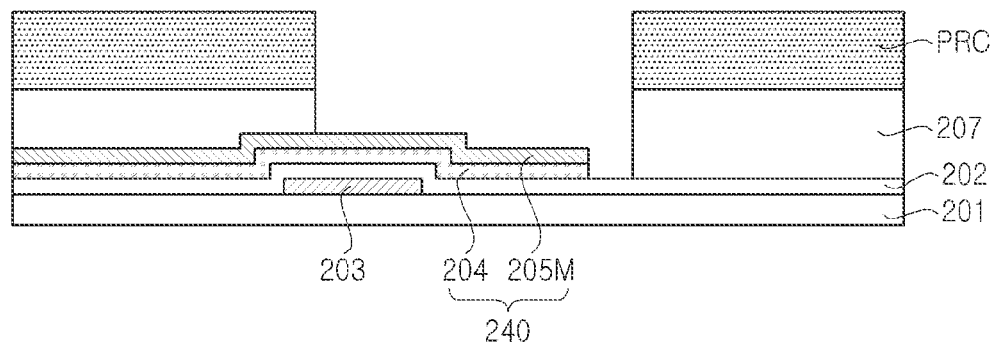

Referring to FIGS. 7D and 7DD, a photoresist pattern PRC, defining a channel area, for formation of a channel area is formed on a second insulating layer 207. The photoresist pattern PRC for formation of the channel area is formed through the third mask process. The second insulating layer 207 is dry etched by using the photoresist pattern PRC as an etching blocking mask.

Figure 7E:
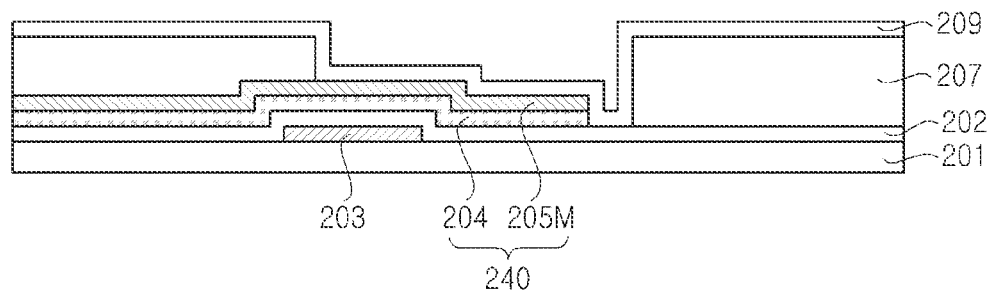
Figure 7F:
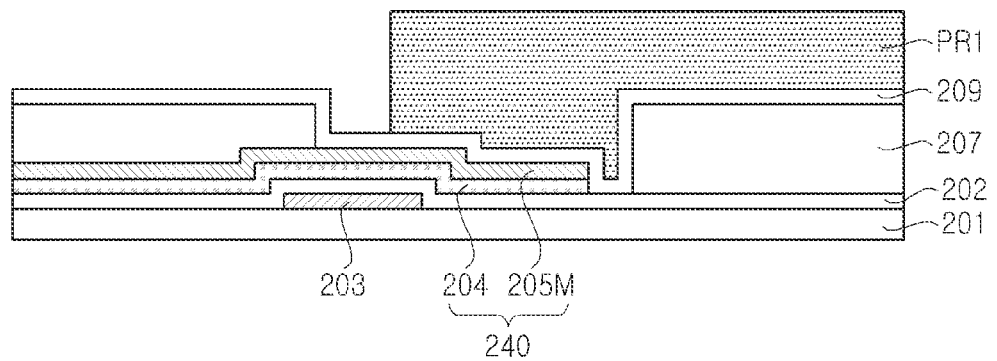
Figure 7D:
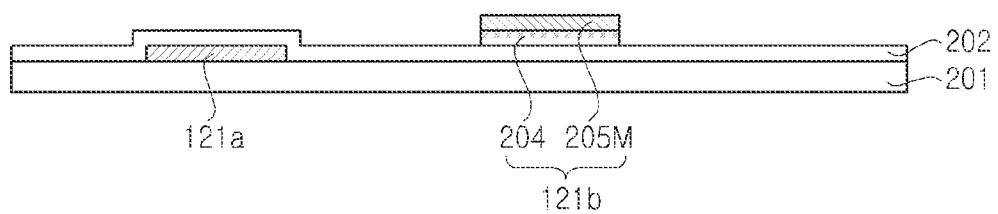
Figure 7E:
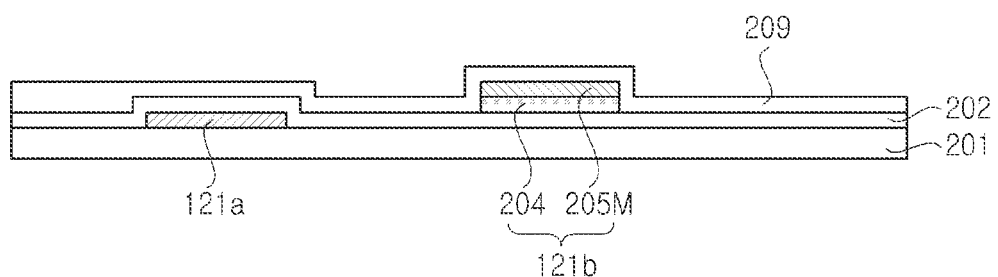
Figure 7F:
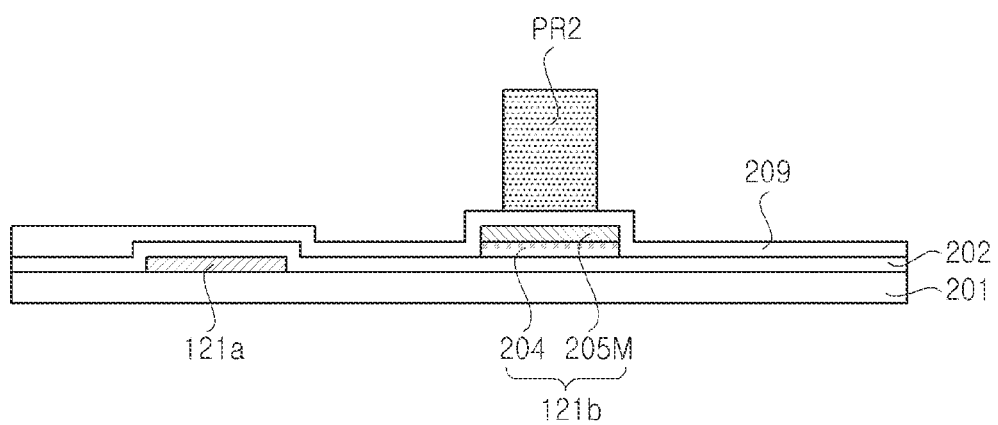
Figure 7G:
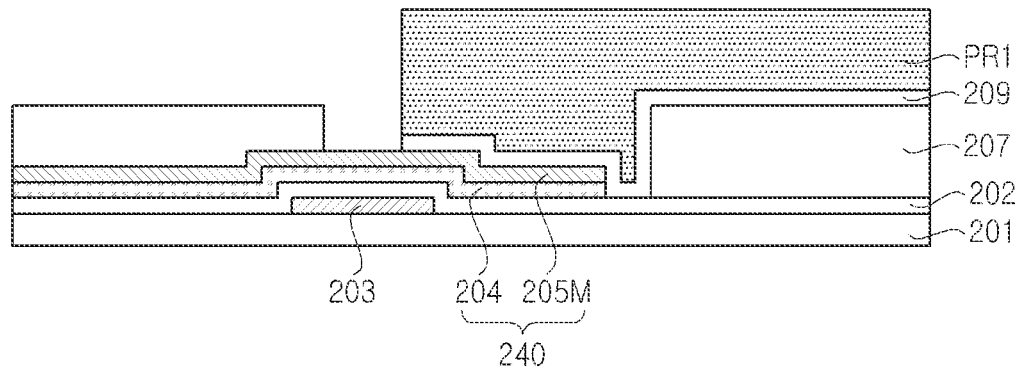
Figure 7H:
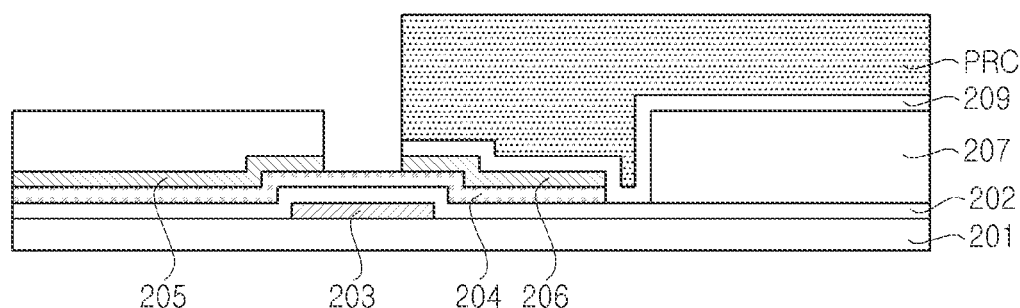
Figure 7I:
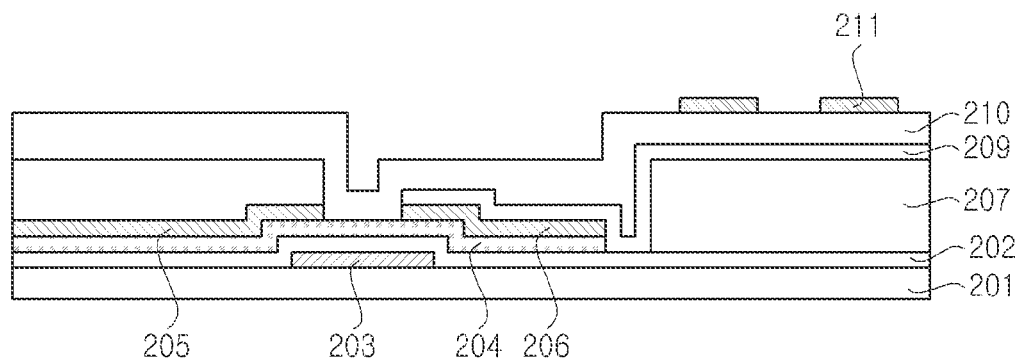
Figure 7G:
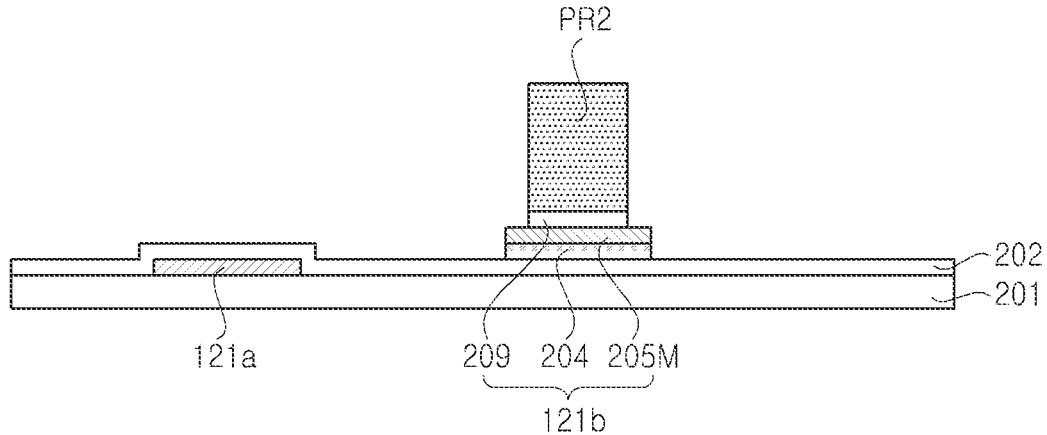
Figure 7H:
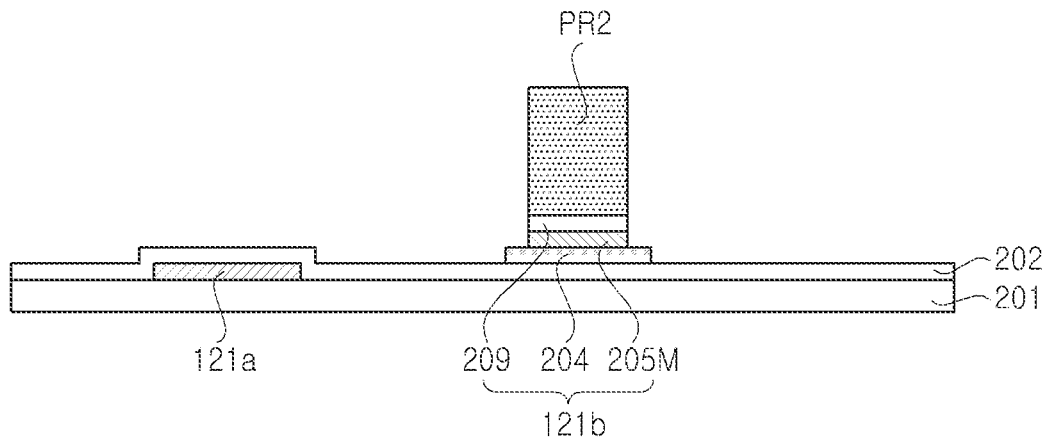
Figure 7I:
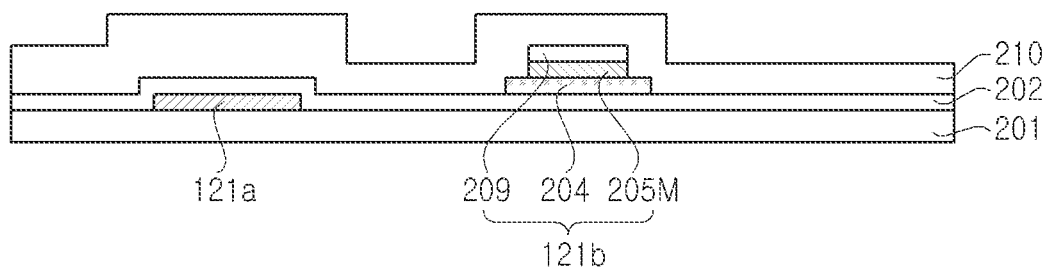

Subsequently, referring to FIGS. 7E and 7EE, the photoresist pattern PRC for formation of the channel area is stripped and removed, and then a transparent electrode material is deposited on the second insulating layer 207. Operations subsequent to the operation of depositing the transparent electrode material on the second insulating layer 207 are the same as the first embodiment of the present invention. That is, referring to FIGS. 7E to 7I, it can be seen that the same process as the first embodiment of the present invention is performed. Therefore, the drawings are applied to a description on a subsequent process, which is not provided.

The second embodiment of the present invention is characterized in that the organic protective layer is not separately provided. Since the organic protective layer is not provided, an adhesive characteristic between the organic protective layer and the insulating layer is not degraded. Specifically, in the first embodiment, the organic protective layer 208 contacts the second and third insulating layers 207 and 210, but, since the organic protective layer 208 has properties different from those of the second and third insulating layers 207 and 210, an adhesive characteristic therebetween can be poor. For this reason, the second embodiment may be applied for enhancing the adhesive characteristic.

It is obvious that the first and second embodiments of the present invention are merely different embodiments with the same technical spirit, and the present invention is not limited thereto.

According to the embodiments of the present invention, by alternately disposing the gate link lines and the data link lines on the first and second layers in the inactive area, an interval between adjacent link lines becomes narrower, and therefore, the number of link lines disposed in each unit area increases, thus realizing a narrow bezel. Also, in manufacturing the IPS-mode LCD device in which the pixel electrodes and the common electrodes are all disposed on the array substrate, provided can be the method of manufacturing the LCD device using six masks.

Moreover, in the method of manufacturing the LCD device using six masks according to the embodiments of the present invention, the operation of forming the link lines performs exposure with the exposure equipment, and the subsequent etching process forms a line width of each link line according to a design irrespective of a process margin of the exposure equipment, thus more simplifying and facilitating a manufacturing process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display (LCD) device having a dual link structure, the LCD device comprising:
   a substrate;
   a plurality of first link lines on the substrate;
   a first insulating layer over the plurality of first link lines; and
   a plurality of second link lines on the first insulating layer, each of the plurality of second link lines not horizontally overlapping with any of the plurality of first link lines and each of the plurality of second link lines comprising a plurality of layers including at least an active layer, an ohmic layer, a source metal layer, and a transparent electrode layer;
   wherein a width of the ohmic layer, a width of the source metal layer, and a width of the transparent electrode layer are narrower than a width of the active layer.

2. The LCD device of claim 1, wherein the plurality of first link lines and the plurality of second link lines are gate link lines, each of the plurality of first link lines and each of the plurality of second link lines being coupled to a corresponding gate line of the LCD device.

3. The LCD device of claim 1, wherein the plurality of first link lines and the plurality of second link lines are data link lines, each of the plurality of first link lines and each of the plurality of second link lines being coupled to a corresponding data line of the LCD device.

4. A liquid crystal display (LCD) device having a dual link structure, the LCD device comprising:
   a substrate;
   a plurality of first link lines on the substrate;
   a first insulating layer over the plurality of first link lines; and
   a plurality of second link lines on the first insulating layer, each of the plurality of second link lines comprising a plurality of layers including at least an active layer, an ohmic layer, a source metal layer, and a transparent electrode layer;
   wherein a width of the ohmic layer, a width of the source metal layer, and a width of the transparent electrode layer are narrower than a width of the active layer, and wherein the width of the ohmic contact layer, the width of the source metal layer, and the width of the transparent electrode layer are substantially the same.

5. A liquid crystal display (LCD) device having a dual link structure, the LCD device comprising:
   a substrate;
   a plurality of first link lines on the substrate;
   a first insulating layer over the plurality of first link lines; and
   a plurality of second link lines on the first insulating layer, each of the plurality of second link lines comprising a plurality of layers including at least an active layer, an ohmic layer, a source metal layer, and a transparent electrode layer;
   wherein a width of the ohmic layer, a width of the source metal layer, and a width of the transparent electrode layer are narrower than a width of the active layer; and
   wherein the entire width of the transparent electrode layer is on the source metal layer.

* * * * *